(12) United States Patent
Schreiber et al.

(10) Patent No.: US 6,300,776 B1
(45) Date of Patent: Oct. 9, 2001

(54) METHOD AND DEVICE FOR DISCRETE-TIME REACTANCE MEASUREMENT

(75) Inventors: Ronald Schreiber; Robert Lalla, both of Lörrach (DE)

(73) Assignee: Endress + Hauser GmbH + Co., Maulburg (DE)

(*) Notice: Subject to any disclaimer, the term of this patent is extended or adjusted under 35 U.S.C. 154(b) by 0 days.

(21) Appl. No.: 09/207,751

(22) Filed: Dec. 8, 1998

(30) Foreign Application Priority Data

Dec. 10, 1997 (EP) .................................................. 97121751

(51) Int. Cl.⁷ ............................ G01R 27/02; G01R 22/00
(52) U.S. Cl. ........................................ 324/607; 324/76.17
(58) Field of Search .................................. 324/607, 649, 324/236, 76.19, 76.22, 76.24, 76.15, 76.17

(56) References Cited

U.S. PATENT DOCUMENTS

| | | | |
|---|---|---|---|
| 4,387,338 | * | 6/1983 | Hecht et al. .......................... 324/236 |
| 4,404,517 | * | 9/1983 | Machida ............................... 324/649 |
| 4,570,116 | * | 2/1986 | Tedd et al. ............................. 324/649 |
| 5,115,189 | | 5/1992 | Holcomb . |
| 5,699,005 | | 12/1997 | Menkhoff et al. . |

FOREIGN PATENT DOCUMENTS 0 421 953 A1  10/1987 (EP) .
36 11 683     10/1987 (DE) .

OTHER PUBLICATIONS

Hiroki Matsumoto, A Switched–Capacitor Digital Capacitance Meter, IEEE Transactions on Instrumentation and Measurement, vol. IM–35, No. 4, Dec. 1986.

* cited by examiner

Primary Examiner—Safet Metjahic
Assistant Examiner—J. Kerveros
(74) Attorney, Agent, or Firm—Bose McKinney & Evans LLP (57) ABSTRACT

For discrete-time reactance measurement the reactance is activated by a clocked generator device with an electric voltage, an electric current or an electric charge. A clocked analyzer device generates an output signal as a function of the reactance to be measured from discrete-time sampling values of the electric voltage, electric current or electric charge. The generator device and the analyzer device are clocked in synchronism, the clock controlling the generator device and the analyzer device being varied in the same way by a frequency or phase modulator for reducing the influence of narrowband disturbances coupled into the circuit caused by aliasing.

28 Claims, 6 Drawing Sheets

METHOD AND DEVICE FOR DISCRETE-TIME REACTANCE MEASUREMENT

BACKGROUND OF THE INVENTION

The invention relates to a method for discrete-time reactance measurement in which the reactance is activated by a clocked generator device with an electric voltage an electric current or an electric charge, and a clocked analyzer device generates an output signal as a function of the reactance to be measured from discrete-time sampled values of the electric voltage, electric current or electric charge, the generator device and analyzer device being clocked in synchronism.

Capacitive and inductive sensors have found wide acceptance for measuring a plurality of physical variables. As a rule, such sensors cannot be analyzed statically, this being the reason why they need to be activated by a generator with an alternating voltage or alternating current. Various possibilities exist for determining the sensor reactance. Due to its good integratability, use is often made of the switched-capacitor technique in which each analysis cycle consists of one or more precharge phases (activation) and one or more measuring phases (analyzing), the switched-capacitor technique thus representing a discrete-time method.

Measuring capacitances by the switched-capacitor technique is known for example from the paper "A Switched-Capacitor Digital Capacitance Meter" by Hiroki Matsumoto and Kenzo Watanabe in the journal "IEEE Transactions on Instrumentation and Measurement", vol. IM-35, No. 4, December 1986, pages 355–359, and from German Patent 35 44 187 A1. In this known method a constant clock is used for activation and analysis so that the time-spacings between the points in times of analysis are always the same. In keeping with the Nyquist sampling theorem it is known that the repetition frequency of the analysis must be at least twice as high as the highest frequency of the variable to be measured, the ratio of the analysis clock frequency to twice the value of the highest frequency of the variable to be measured being termed the oversampling rate. When this ratio is smaller than unity the Nyquist sampling theorem is violated and aliasing errors result.

In the majority of applications the changes in time of the reactance to be measured are relatively slow so that a high oversampling rate is possible as is also often made use of to improve the accuracy of measurement. However, due to external influencing factors, disturbing alternating signals are also coupled into the reactance to be measured. The frequencies of these disturbances may be in ranges which result in violation of the Nyquist sampling theorem. Aliasing then results in the interference signal being imaged on the wanted signal and thus in the reactance measurement being falsified. More particularly, it is in the more immediate vicinity of the whole number multiples of the analysis clock frequency (sampling frequency) that ranges highly sensitive to interference materialize.

On the other hand it is known to vary a system clock by frequency or phase modulation to reduce disturbing effects. Various known solutions in this respect read from EP 0 715 408 A1, and a further solution is stated in which an original clock is modulated by means of a phase modulator as a function of a random signal source. Described in DE 196 37 942 A1 is a method of modulating the detection clock of a digital oscilloscope in making use of a phase-locked loop.

SUMMARY OF THE INVENTION

As compared to this the invention is based on the object of reducing the influence of narrowband disturbances coupled into the system by aliasing in discrete-time clocked reactance measurements.

On the basis of the method as cited at the outset this object is achieved in accordance with the invention by the clock controlling the generator device and the analyzer device being varied in the same way by frequency or phase modulation.

The method in accordance with the invention results in the effect that as compared to conventional measurement methods employing a constant activation and analysis clock the sensitivity in the vicinity of multiples of the sampling frequency is less and spread over a broader frequency range. Thus, any disturbance not covering the full bandwidth of a sensitive range has less influence on the measurement than when measuring with a constant clock.

A device for implementing the method in accordance with the invention including a clocked generator device for activating the reactance to be measured with an electric voltage, an electric current or an electric charge, a clocked analyzer device for generating an output signal as a function of the reactance to be measured from discrete-time sampling values of the electric voltage, the electric current or the electric charge, and a clock generator producing a clock controlling the generator device and the analyzer device in common comprises in accordance with the invention a control device for modulating the frequency or phase of the clock generated by the clock generator.

Further aspects and further embodiments of the method and device in accordance with the invention are characterized in the sub-claims.

BRIEF DESCRIPTION OF THE DRAWINGS

Further features and advantages of the invention read from the following description of example embodiments with reference to the drawings in which.

DETAILED DESCRIPTION OF THE PREFERRED EMBODIMENT

Figure 1:
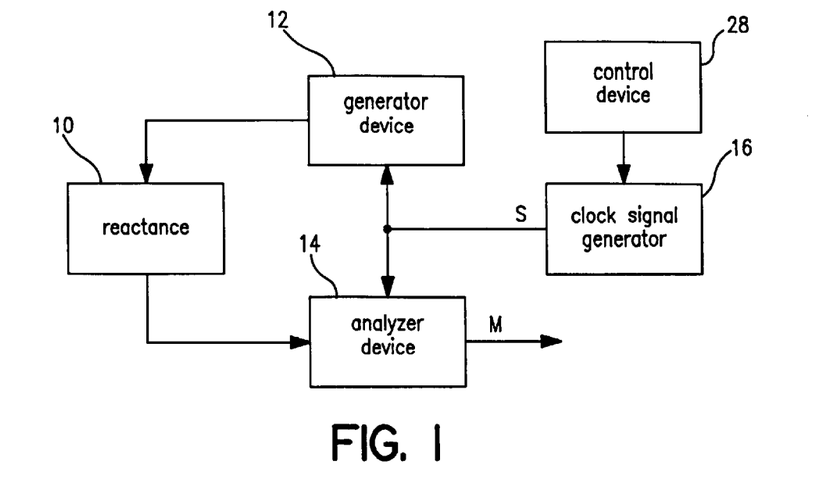
FIG. 1 is block diagram of a device for discrete-time reactance measurement in accordance with the invention.

Referring now to FIG. 1 there is illustrated the block diagram of an arrangement for clocked measurement of a reactance. The reactance to be measured which may be, for example, a capacitive or inductive sensor for sensing a physical variable, is represented by the circuit block 10. As a rule, such sensors do not permit static analysis and thus need to be activated by a generator device 12 with an alternating voltage, an alternating current or an electric charge. Due to the magnitude of the alternating voltage, alternating current or electric charge influenced by the reactance 10 an analyzer device 14 generates an output signal indicating the size of the reactance to be measured.

Various possibilities exist for determining the reactance, use often being made of the switched-capacitor technique due to the good integratability it offers and which operates according to the principle of quantisized charge transport using switched-capacitor (SC) structures. In this arrangement each analysis cycle is made up of one or more clocked precharge phases for activation and one or more clocked measuring phases for analysis. The switched-capacitor technique thus represents a discrete-time method, this being the reason why FIG. 1 contains a clock signal generator 16 which furnishes a clock signal S to the generator device 12 and to the analyzer device 14. The clock signal S dictates the clock for activating by the generator device 12 and the clock for analysis by the analyzer device 14. It is the analysis circuit 14 which produces an output signal M as a function of the reactance to be measured. In usual SC circuits generator device and analyzer device are combined.

Figure 2:
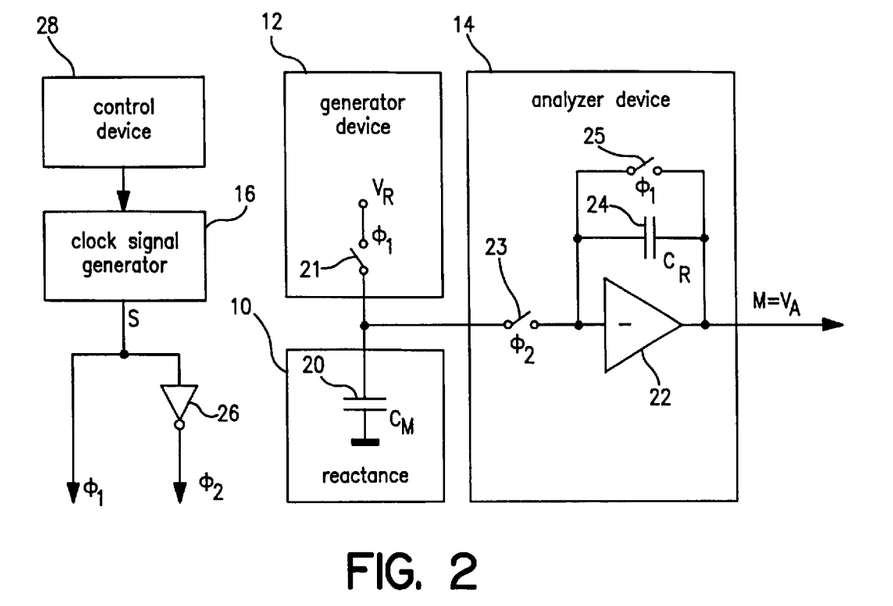
FIG. 2 is a circuit diagram of an embodiment of the device as shown in FIG. 1 in switched-capacitor technique.

Referring now to FIG. 2 there is illustrated, by way of an example, the basic principle of an assembly for measuring the capacitance $C_M$ of a capacitive sensor 20 by the switched-capacitor technique. The capacitive sensor 20 is represented symbolically as a capacitor. The generator device 12 contains a switch 21 which in the closed condition applies a reference voltage $V_R$ to the capacitance $C_M$ and in the open condition opens the connection between the capacitance $C_M$ and the reference voltage $V_R$. The analyzer device 12 contains an amplifier 22 having a high negative gain and a switch 23 which in the closed condition connects the point of contact between the capacitance $C_M$ and the switch 21 to the input of the amplifier 22. Located in the feedback circuit of the amplifier 22 is a reference capacitor 24 having the capacitance $C_R$, connected in parallel to a switch 25. When the switch 25 is opened the amplifier 22 forms together with the reference capacitor 24 an integrator. When the switch 25 is closed the reference capacitor 24 discharges, as a result of which the integrator is reset to zero.

Figure 3:
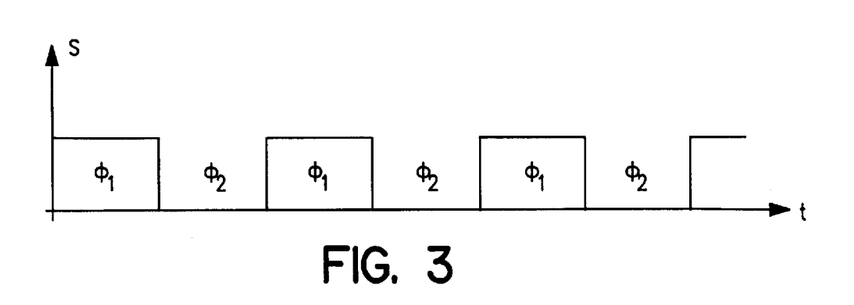
FIGS. 3 to 9 are plots assisting in explaining the effect achieved by the invention.

The clock signal S generated by the clock signal generator 16 is a square wave signal having the frequency $\omega_s = 2\pi f_s$ as shown in the time plot in FIG. 3. The clock signal S has alternating phases $\phi_1$ in which it is HI, and $\phi_2$ in which it is LO. The switches 21 and 25 are controlled by the clock signal S so that they are closed in the phases $\phi_1$ and open in the phases $\phi_2$, whereas the switch 23 is controlled so that it is open in the phases $\phi_1$ and closed in the phases $\phi_2$. When all switches are configured so that they are closed on a HI signal controlling them and are open on a LO, control in the opposite sense may be simply achieved by applying the clock signal S to the switches 21 and 25 directly and to the switch 23 via an inverter 26. For a better overview in FIG. 2 the connections between the outputs of the clock signal generator 16 or the inverter 26 and the switches 21, 23, 25 are not shown, it instead being indicated for each switch by which phase of the clock signal S the switch is controlled. Thus, in each phase $\phi_1$ of the clock signal S the capacitance to be measured $C_M$ of the capacitive sensor 20 is charged to the reference voltage $V_R$ and the capacitance $C_R$ of the reference capacitor 24 discharged, and in each phase $\phi_2$ of the clock signal S the capacitance $C_M$ is discharged in the reference capacitor $C_R$. Accordingly, at the output of the amplifier a voltage $V_A$ results as the measured signal M in the phase $\phi_2$ which is proportional to the capacitance to be measured $C_M$:

$$V_A = V_R \frac{C_M}{C_R}$$

Figure 4:
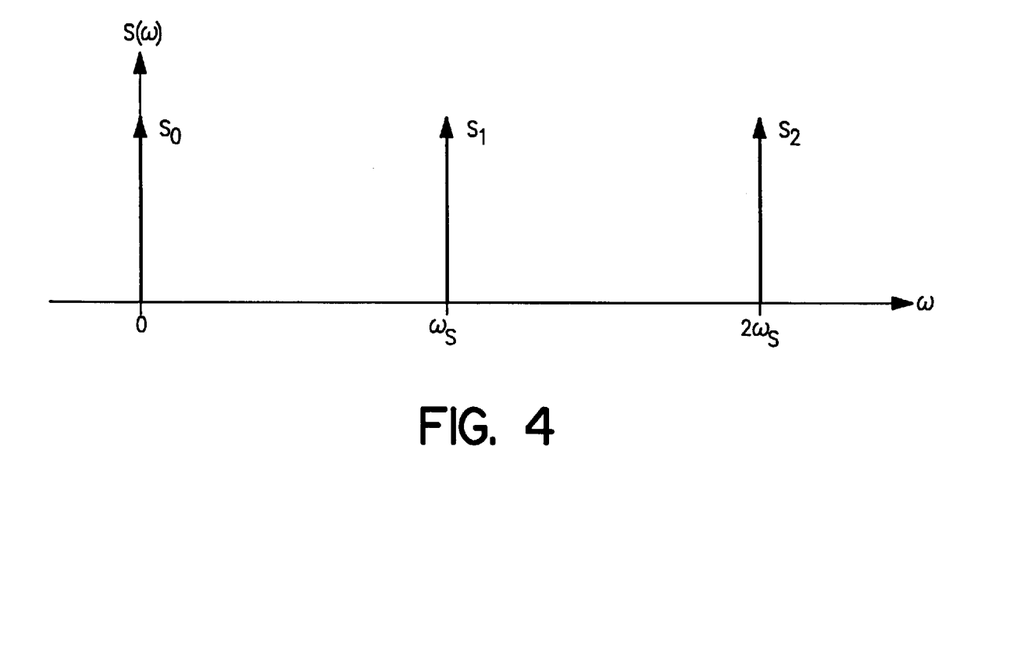

The analyzer device 14 as shown in FIG. 1 and FIG. 2 operates according to the sampling principle, the clock signal S thereby dictating the time spacing $T_S$ between two analysis actions. In usual clocked reactance measurement arrangements the frequency $f_S$ of the clock signal and accordingly also the time spacing $T_S$ is constant. For this case the power density spectrum $S(\omega)$ of the corresponding sampling function is shown in FIG. 4, this being formulated as:

$$S(\omega) = \sum_{i=-\infty}^{\infty} S_i \cdot \delta(\omega - i \cdot \omega_S)$$

where $S(\omega)$
≅power density spectrum of a usual sampling function
≅sampling frequency $$\omega_S = \frac{2 \cdot \pi}{T_S} \cong \text{sampling frequency}$$

$S_i$≅weighting corresponding to the aperture and frequency response of the analysis circuit $\delta(\omega)$ Dirac function In accordance with the Nyquist sampling theorem the repetition frequency $\omega_s$ of the analysis needs to be at least twice as high as the bandwidth $\omega_N$ of the variable to be measured. The relationship:

$$r = \frac{\omega_S}{2 \cdot \omega_N}$$

is termed the oversampling rate. Violation of the Nyquist sampling theorem (i.e. when r<1) results in aliasing errors.

In the majority of applications the changes in time of the reactance to be measured are relatively slow and the bandwidth $\omega_N$ Of the wanted signal may usually be well estimated. A high oversampling rate (of the order of magnitude $10^3$) is thus possible and is also often put to use to improve accuracy in measurement accordingly.

However, disturbing alternating signals are coupled into the reactance to be measured by external influencing factors, the frequencies of which may be in ranges which result in violation of the Nyquist sampling theorem. By aliasing, from the frequency $\omega_p$ of the original disturbance signal a sampled disturbance signal having the frequency $\omega_{pa}$ is obtained:

$$\omega_{p_a} \omega_p - i \cdot \omega_S \text{ mit: } i = -\infty, \ldots, -1, 0, 1, \ldots, \infty$$

Figure 5:
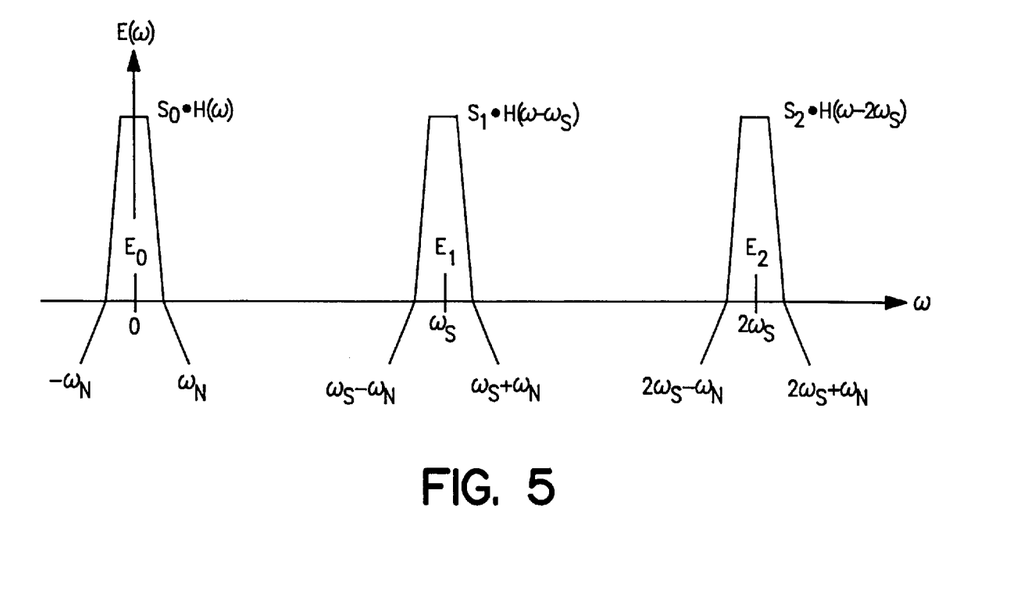

Referring now to FIG. 5 there is illustrated in which frequency ranges imaging of the disturbance signal and thus a falsification of the reactance measurement may materialize, it being evident that ranges highly sensitive to disturbance result in the near vicinity of the whole number multiples of the sampling frequency $\omega_s$.

The analyzer circuit and the subsequent signal processing, filter out by their transfer function $H(\omega)$ the frequency range (baseband) of interest. Due to the high oversampling rate the passband of the baseband as compared to $\omega_s$ is very narrow. By aliasing, however, several frequency ranges of the interference signal of the analyzer circuit are imaged in this passband, this being the reason why the analyzer circuit becomes sensitive to several frequency ranges:

$$E(\omega)=H(\omega)*S(\omega)$$

$$E(\omega) = \sum_{i=-\infty}^{\infty} S_i \cdot H(\omega - i \cdot \omega_S)$$

where $E(\omega) \cong$ sensitivity of the analyzer circuit $H(\omega) \cong$ transfer function of the baseband $A*B \cong$ folding of A and B Disturbance s in the vicinity of whole number multiples of the sampling frequency are damped only by the weighting factors $S_i$. The areas $E_i$ of the sensitive ranges are calculated from:

$$E_i = \int_{i \cdot \omega_S - \omega_N}^{i \cdot \omega_S + \omega_N} E(\omega) \cdot d\omega = S_i \cdot \int_{-\omega_N}^{\omega_N} H(\omega) \cdot d\omega$$

In the arrangements as shown in FIGS. 1 and 2 the influence of narrowband disturbances coupled into the circuit prompted by aliasing are reduced by the clock signal S generated by the clock signal generator 16 being modulated by a control device 28 for the generator device 12 and for the analyzer device 14. The reactance 10 or 20 is thus measured with a sampling frequency variable in defined limits from $\omega_s - \Delta\omega_s$ to $\omega_s + \Delta\omega_s$. The time $T_S$ between two sampling events is then $T_{S1}$ as a minimum and $T_{S2}$ as a maximum, where:

$$T_{S1} \leq T_S \leq T_{S2} \text{ und } T_{S1} \leq T_{S2}$$

Figure 6:
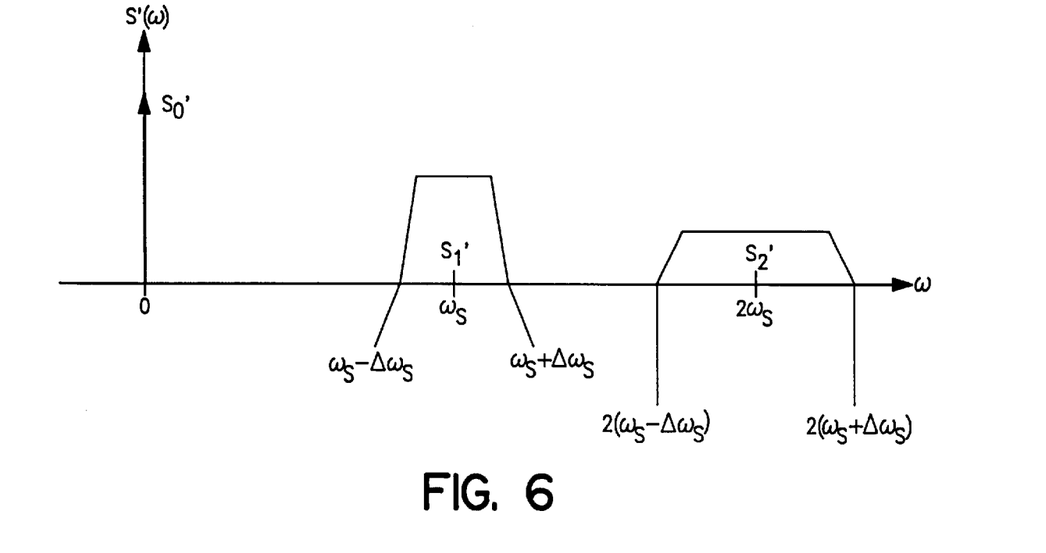

To simply further explanations it is assumed that the time $T_S$ is varied only slowly between $T_{S1}$ and $T_{S2}$, thus resulting approximately in the power density spectrum of the sampling frequency as shown in FIG. 6, where:

$$\omega_S = \pi \cdot \frac{T_{S1} + T_{S2}}{T_{S1} \cdot T_{S2}}$$

$$\Delta\omega_S = \pi \cdot \frac{T_{S1} - T_{S2}}{T_{S1} \cdot T_{S2}}$$

Since in modulation the power of the sampling frequency remains unchanged, the following holds for the area contents $S_i'$:

$$S_i' = \int_{i \cdot (\omega_S - \Delta\omega_S)}^{i \cdot (\omega_S + \Delta\omega_S)} S'(\omega) \cdot d\omega = S_i$$

mit: $i = -\infty, \ldots -1, 0, 1, \ldots, \infty$

Figure 7:
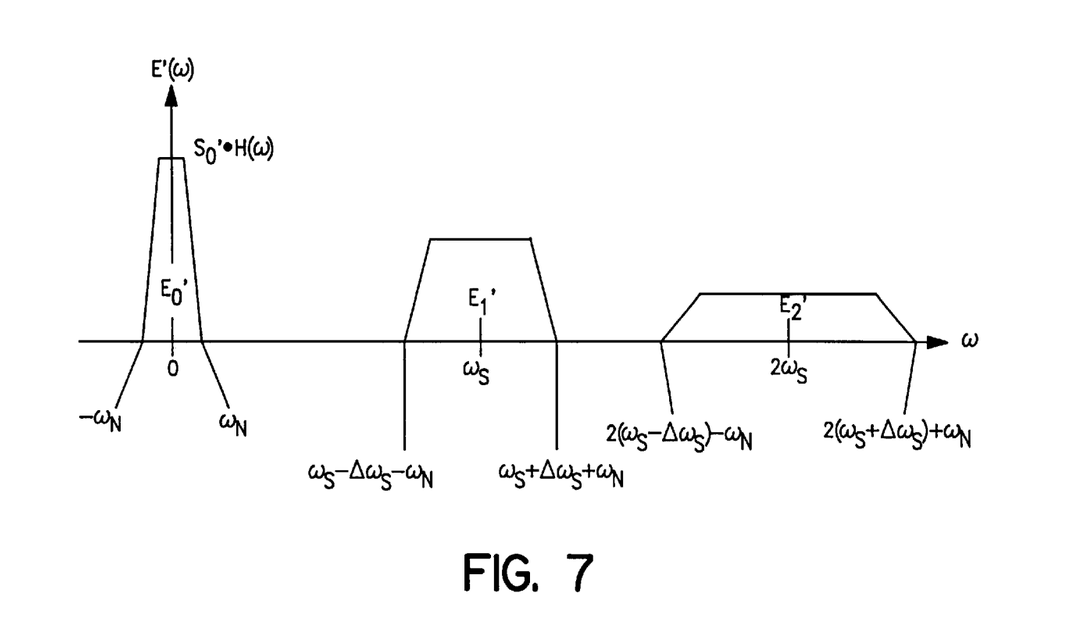

By folding with the transfer function $H(\omega)$ the sensitivity $E'(\omega)$ of the measuring arrangement as shown in FIG. 7 is obtained as $$E'(\omega)=H(\omega)*S'(\omega)$$

$$E'(\omega) = \int_{-\infty}^{\infty} H(\Omega) \cdot S'(\omega - \Omega) \cdot d\Omega$$

where:

$E'(\omega) \cong$ sensitivity of the analyzer circuit with modulated sampling clock $S'(\omega) \cong$ power density spectrum of the modulated sampling sequence $H(\omega) \cong$ transfer function of subsequent signal processing $A*B \cong$ folding of A and B For the areas $E_i'$ of the sensitive measuring ranges we have:

$$E_i' = \int_{i \cdot (\omega_S - \Delta\omega_S) - \omega_N}^{i \cdot (\omega_S + \Delta\omega_S) + \omega_N} E'(\omega) \cdot d\omega = E_i$$

and thus $$\int_{i \cdot (\omega_S - \Delta\omega_S) - \omega_N}^{i \cdot (\omega_S + \Delta\omega_S) + \omega_N} E'(\omega) \cdot d\omega = \int_{i \cdot \omega_S - \omega_N}^{i \cdot \omega_S + \omega_N} E(\omega) \cdot d\omega$$

As compared to the usual measuring arrangement operating with a constant sampling frequency the sensitivity $E'(\omega)$ in the vicinity of whole number multiples of the sampling frequency is less and spread over a larger frequency range and thus any disturbance not spread over the full bandwidth of a sensitive range has less influence on the measuring arrangement than when employing a constant sampling frequency.

Figure 8:
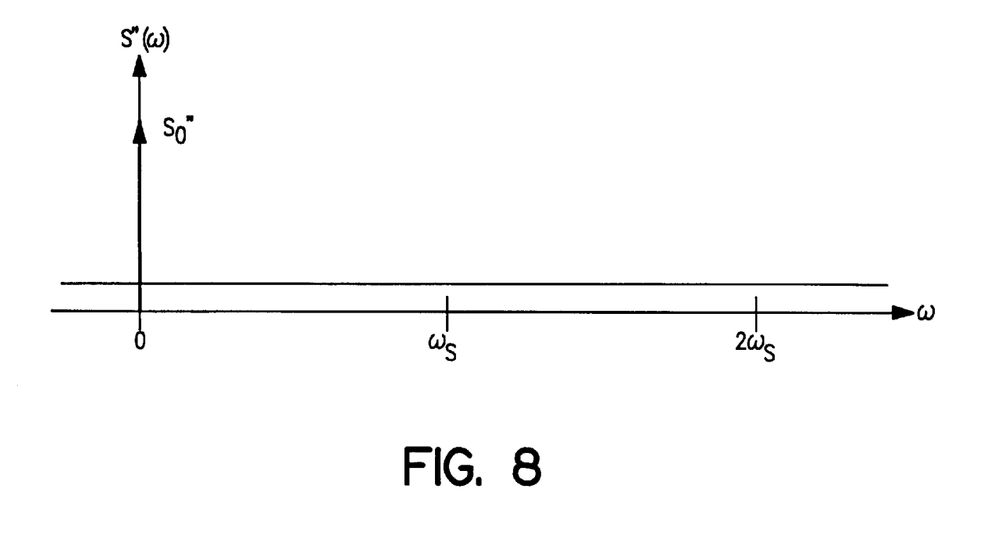
Figure 9:
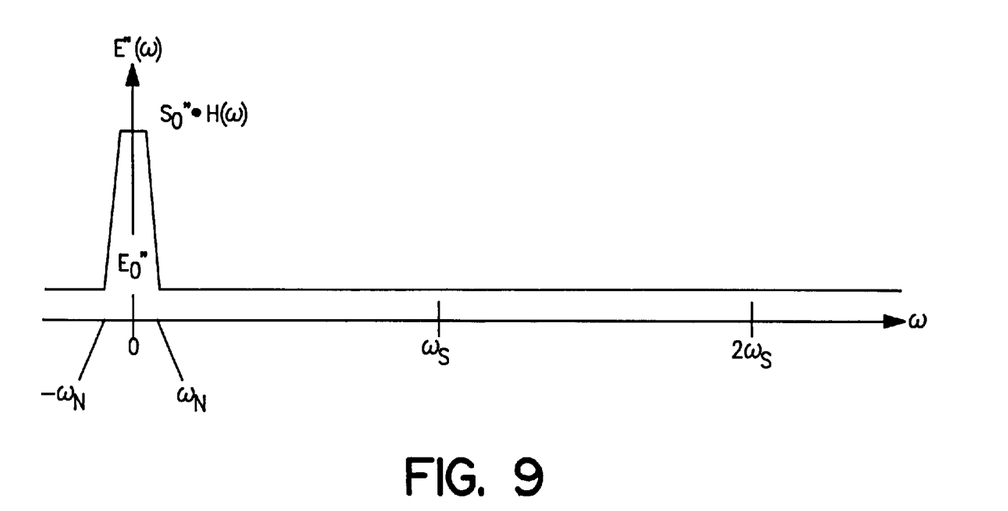

In the above description it was assumed for the sake of simplification that the change in the sampling frequency is slow. However, the principle as described functions just as well for any kind of frequency and phase modulation of the sampling clock. The desired effect is always achieved when. in addition to the same proportion, all spectral proportions of the sampling frequency are distributed as near evenly as possible over wide frequency ranges. FIG. 8 illustrates the ideal situation of an evenly distributed power density spectrum $S''(\omega)$, the sensitivity $E''(\omega)$ resulting therefrom being evident from FIG. 9.

For the generator device 12 and the analyzer device 14, in addition to the switched-capacitor circuits, one of which is illustrated as an example in FIG. 2, a plurality of other possibilities for achieving the desired result is known. Circuits in switched-capacitor technique have the advantage that they are able to furnish an analog output signal which is independent of clock variations, this being the case in the circuit as shown in FIG. 2.

Figure 10:
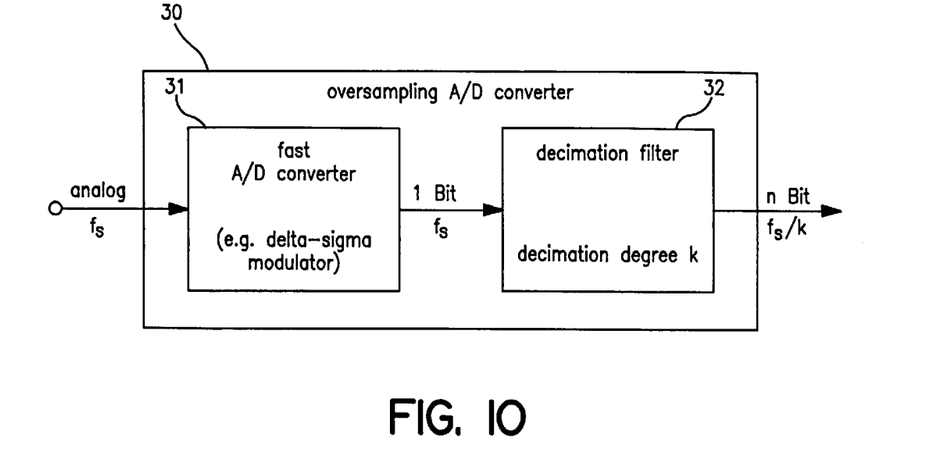
FIG. 10 is a block diagram of an oversampling A/D converter as applicable in the analyzer circuit of the device as shown in FIG. 1.

If the output signal of the analyzer device 14 is required digitized, the analyzer device is then expanded preferably by an oversampling A/D converter. The principle of such an oversampling A/D converter 30 is illustrated in FIG. 10, it containing a fast but inaccurate A/D converter 31 and a decimation filter 32 having a decimation degree k. The A/D converter 31 formed, for example, by a delta-sigma modulator receives at the input the analog sampling values in the sampling clock $f_S$ and furnishes at the output digital signals having a 1 bit resolution in the sampling clock $f_S$. Appearing at the output of the decimation filter 32 are digital signals having a resolution of n bits ($n \geq 1$) in the clock $f_S/k$.

It is also possible to use for the A/D converter 31 a higher order delta-sigma modulator furnishing digital signals with a resolution of m bits (m>1) in the sampling clock $f_S$, the resolution obtained at the output of the decimation filter 32 then being n>m.

Figure 11:
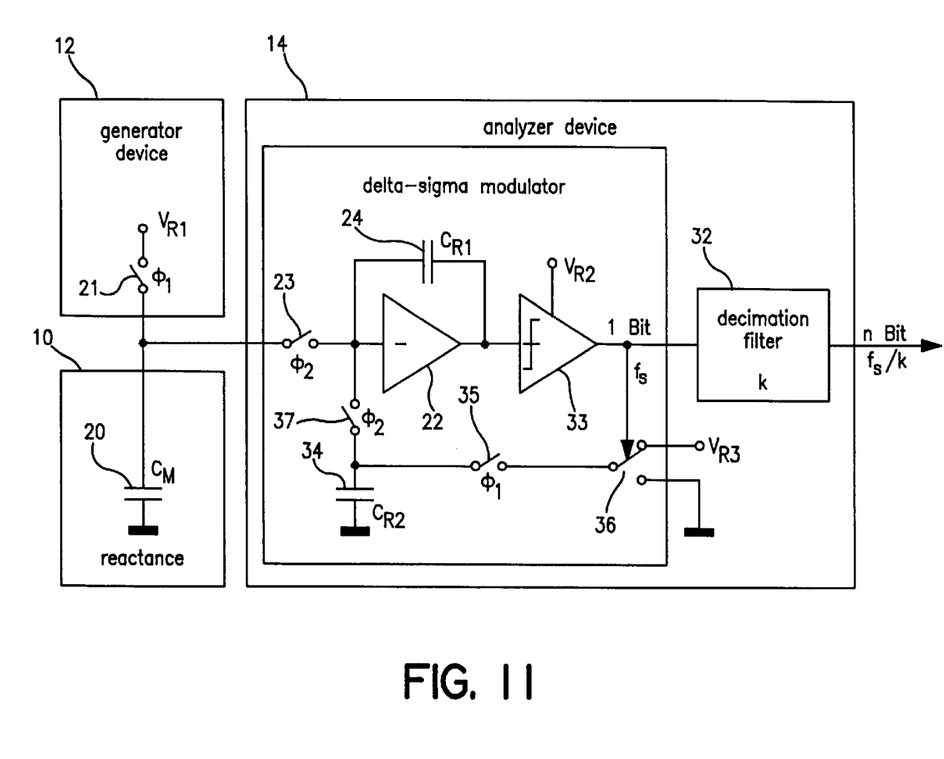
FIG. 11 is a circuit diagram of an embodiment of the device as shown in FIG. 1 in switched-capacitor technique including an oversampling A/D converter as shown in FIG. 10.

Referring now to FIG. 11 there is illustrated how the oversampling A/D converter as shown in FIG. 10 may be achieved in the case of the sampling device 14 configured in switched-capacitor technique as shown in FIG. 2. The circuit components, corresponding to those of FIG. 2, are identified by like reference numerals. The clock signal generator 16 and the control device 28 are not shown in FIG. 11 to simplify the illustration. To form the delta-sigma modulator 31 the amplifier 22 is followd by a comparator 33 and a second reference capacitor 34 having the capacitance $C_{R2}$, the one terminal of which ia applied to GND and the other terminal of which may be connected through a switch 35 to a selector switch 36 connected by the output signal of the comparator 33 and by a switch 37 which may be connected to the input of the amplifier 22. The switch 35 is closed in synchronism with the switch 21 in each phase $\phi_1$ of the clock signal S and opened in every phase $\phi_2$ of the clock signal S. The switch 37 is closed in synchronism with the switch 23 in every phase $\phi_2$ of the clock signal S and opened in every phase $\phi_1$ of the clock signal S, whereas the switch 25, connected in parallel to the first reference capacitor 24 in FIG. 2, the capacitance of which is identified by $C_{R1}$ in FIG. 11, is eliminated. The reference voltage applied to the capacitive sensor 20 via the switch 21 is identified $V_{R1}$ in FIG. 11. The comparator 33 receives a second reference voltage $V_{R2}$ and generates by comparing the output signal of the amplifier 22 to the second reference voltage $V_{R2}$ a digital output signal having a resolution of 1 bit in the sampling clock $f_S$. This digital output signal controls the selector switch 36 so that via the switch 35, when this is closed in the phase $\phi_1$, a third reference voltage $V_{R3}$ is applied to the reference capacitor 34 when the digital output signal is a "1", and GND potential is applied to the reference capacitor 34 when the digital output signal is a "0". Furthermore, the digital output signal of the comparator 33 is fed to the decimation filter 32 connected to the output of the delta-sigma modulator 31 with the decimation degree k. At the output the decimation filter 32 outputs digital signals having the resolution n bit in the clock $f_S/k$, the sampling clock $f_S$ being varied in the way as already described.

Figure 12:
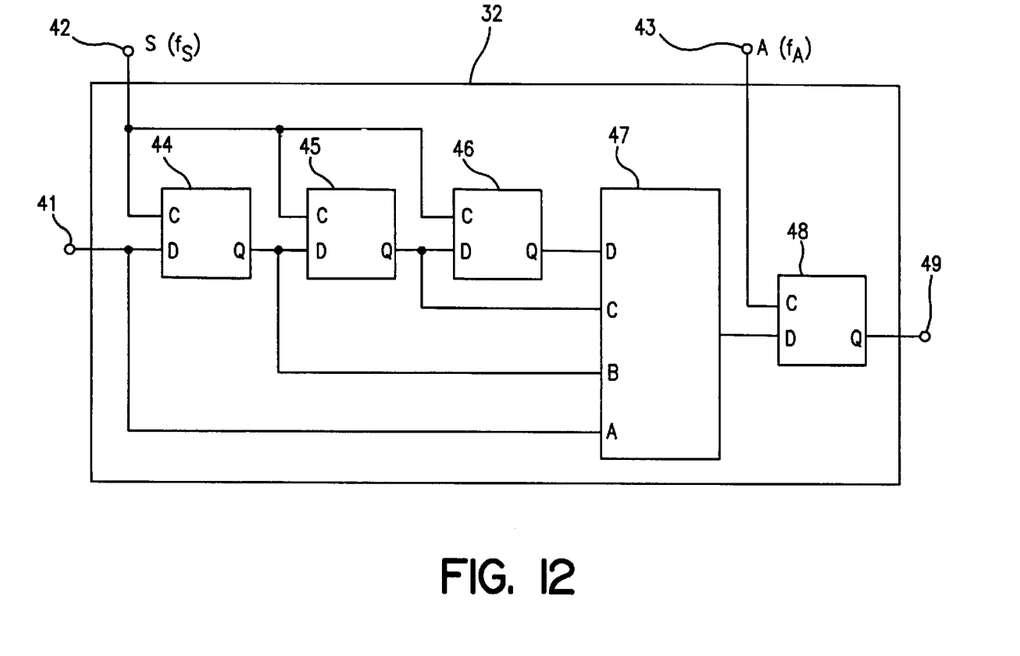
FIG. 12 is a block diagram of a decimation filter furnishing an output signal having a constant output clock for a variable input clock.

Although the oversampling A/D converter 30 is operated with the variable clock $f_S$ a data flow having a constant sampling rate is furnished at the output of its decimation filter 32. For this purpose the changes in the clock $f_S$ are compensated, for example, by a corresponding change in the decimation degree k. FIG. 12 is a schematic representation of how the decimation filter 32 is configured to achieve this effect.

The decimation filter 32 as shown in FIG. 12 receives at one signal input 41 the digital signal with the resolution of 1 bit in the variable sampling clock $f_S$, the clock signal S having the variable clock $f_S$ at a first clock input 42 and a clock signal A having the desired constant output clock $f_A$ at a second clock input 43. It contains three registers 44, 45, 46 connected cascaded, the clock inputs C of which are connected to the first clock input 42. The signal input D of the register 44 is connected to the signal input 41 of the decimation filter 32, signal input D of the register 45 to the output Q of the register 44, and signal input D of the register 46 connected to the output Q of the register 45. An adder 47 has one input A directly connected to the signal input 41 of the decimation filter 32, and three further inputs B,C,D each connected to the output Q of one of the registers 44, 45, 46. Thus, the digital signals supplied to the signal input 41 are shifted in the variable sampling clock $f_S$ in sequence through the registers 44, 45, 46 and the adder 47 receives at its inputs at the same time as the digital signal applied to the input 41, also the three previous digital signals held in the registers 44, 45, 46. The adder 47 forms the sum of these four signals which it outputs at its output. Connected to the output of the adder 47 is the signal input D of a further register 48, the clock input C of which is connected to the clock input 43 of the decimation filter 32. Accordingly, the register 48 accepts the digital sum signals output by the adder 47 in the desired constant output clock $f_A$ and it outputs these digital sum signals with increased resolution and in a constant clock $f_A$ at the output 49 of the decimation filter 32.

A data flow having a constant sampling rate may also be achieved by employing a decimation filter having a fixed decimation degree k, this being possible when the clocks having a differingly long k of the sampling values used for decimation always result in a constant time in their sum, this condition being satisfied in periodic modulation of the clock at least for whole number multiples of the repetition duration.

Modulating the sampling clock may be done by an analog or digital technique. The control device 28 may be combined with the clock generator 16 also in a module, one such module being described for example in EP 0 715 408 A1. For generating a stochastic clock signal, oscillator circuits having a high frequency jitter are suitable, for example. A circuit for generating a detection clock with phase jitter employing a phase-locked loop is described in DE 196 37 942 A1.

Examples for a determinate modulation are sawtooth or delta changes in the clock frequency.

Figure 13:
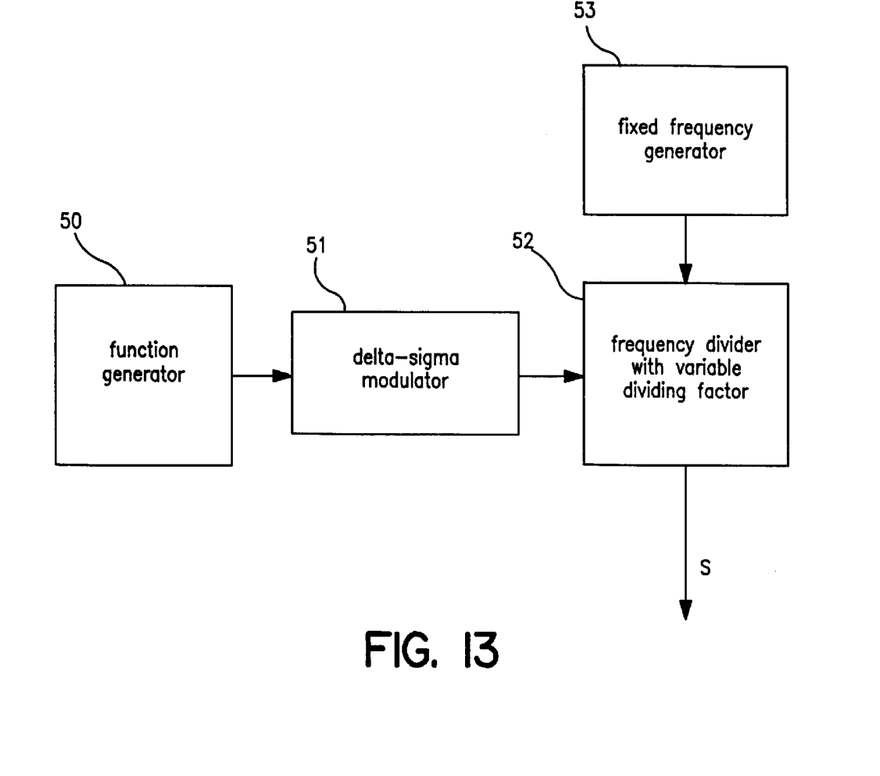
FIG. 13 is a block diagram of a clock generator furnishing a digitally modulated clock, in combination with a control device.

When the sampling clock is modified by digital means, the time $T_S$ between two samplings may assume only one of the N discrete values in each case. By suitably sequencing such discrete spacings intermediate frequencies may also be formed in the frequency spectrum. For selecting the spacings a delta-sigma modulator may be employed, for example. FIG. 13 illustrates one such embodiment of a combination control device and clock generator suitable for this purpose, it containing a function generator 50 generating a function signal 50 corresponding to the desired modulation function. The output of the function generator 50 is connected to the input of a delta-sigma modulator 51. The delta-sigma modulator 51 controls the dividing factor of a frequency divider 52 having a selectable dividing factor which receives at its signal input the output signal of a fixed frequency generator 52. The output signal of the frequency divider 53 forms the clock signal S, the frequency $f_S$ of which is dictated by the variable dividing factor of the frequency divider 52 which is set by the delta-sigma modulator 51 in accordance with the function signal of the function generator 50.

What is claimed is:

1. A method for discrete-time measurement of a reactance, the method comprising the steps of:

activating the reactance to be measured by a clocked generator device;

sampling with a clocked analyzer device discrete-time values of at least one of an electric voltage, an electric current and an electric charge, which values are influenced by said reactance, said activating step and said sampling step working in an opposition of phase controlled by at least one clock signal;

generating with said analyzer device an output signal as a function of said reactance from said discrete-time sampled values; and varying said at least one clock signal by at least one of frequency modulation and phase modulation to produce a spectrum spreading effect that reduces narrow band noise in said output signal.

2. The method as set forth in claim 1, wherein said varying step includes modulating at least one of a frequency and a phase of said clock signal by a periodic signal.

3. The method as set forth in claim 1, wherein said varying step includes modulating at least one of a frequency and a phase of said clock signal by a random signal.

4. The method as set forth in claim 1, wherein said varying step includes changing at least one of a frequency and a phase of said clock signal between at least two of a finite number of values.

5. The method as set forth in claim 4, wherein said varying step further includes deriving said at least one of a frequency and a phase of said clock signal from a constant basic clock.

6. An apparatus for discrete-time measurement of a reactance, the apparatus comprising:
a generator device including a first switch to electrically activate said reactance;
an analyzer device including a second switch to couple said reactance to said analyzer device to generate an output signal as a function of said reactance from discrete-time sampling values of at least one of an electric voltage, an electric current and an electric charge, said second switch working in an opposition of phase to the first switch;
a clock generator operably coupled to said generator device and said analyzer device, said clock generator being operable to generate at least one clock signal for controlling said first and second switches of said generator device and said analyzer device; and
a control device operably coupled to said clock generator, said control device being operable to modulate at least one of a frequency and a phase of said clock signal to dynamically shift opening and closing of said first and second switches to produce a spectrum spreading effect that enhances narrow band noise immunity in the reactance measurement.

7. The apparatus as set forth in claim 6, wherein said generator device and said analyzer device are configured in a switched-capacitor technique.

8. The apparatus as set forth in claim 6, wherein said analyzer device includes an oversampling A/D converter, and wherein said analyzer device is further operable to furnish an output signal having a constant output clock even when said clock signal is varied.

9. The apparatus as set forth in claim 8, wherein said oversampling A/D converter includes a decimation filter, said decimation filter being operable to provide a variable degree of decimation.

10. The apparatus as set forth in claim 8, wherein said oversampling A/D converter includes a decimation filter, said decimation filter being operable to provide a constant degree of decimation, and wherein said control device is further operable to vary said at least one of said frequency and phase of said clock signal such that the sum of the variable spacings between said sampling values is a constant value.

11. The apparatus as set forth in claim 9, wherein said oversampling A/D converter includes a delta-sigma modulator, said delta-sigma modulator being operably coupled to said decimation filter.

12. The apparatus as set forth in claim 6, wherein said analyzer device is further operable to generate an analog output signal, said analog output signal being independent of variations of said clock signal.

13. The apparatus as set forth in claim 6, wherein said control device includes a function generator, said function generator being operable to dictate said modulation of said at least one of said frequency and said phase of said clock signal.

14. The apparatus as set forth in claim 13, wherein said clock generator includes a fixed frequency generator and a frequency divider operably coupled to said fixed frequency generator, said frequency divider being operable to provide a selectable dividing factor, and wherein said function generator controls said dividing factor.

15. The apparatus as set forth in claim 14, wherein said function generator is operably coupled to a delta-sigma modulator.

16. The method as set forth in claim 2, wherein said varying step includes changing at least one of a frequency and a phase of said clock signal between at least two of a finite number of values.

17. The method as set forth in claim 3, wherein said varying step includes changing at least one of a frequency and a phase of said clock signal between at least two of a finite number of values.

18. The apparatus as set forth in claim 7, wherein said analyzer device includes an oversampling A/D converter, and wherein said analyzer device is further operable to furnish an output signal having a constant output clock even when said clock signal is varied.

19. The apparatus as set forth in claim 10, wherein said oversampling A/D converter includes a delta-sigma modulator operably coupled to said decimation filter.

20. The apparatus as set forth in claim 10, wherein said analyzer device is further operable to generate an analog output signal, said analog output signal being independent of variations of said clock signal.

21. The apparatus as set forth in claim 7, wherein said control device includes a function generator, said function generator being operable to dictate said modulation of said at least one of said frequency and said phase of said clock signal.

22. The apparatus as set forth in claim 8, wherein said control device includes a function generator, said function generator being operable to dictate said modulation of said at least one of said frequency and said phase of said clock signal.

23. The apparatus as set forth in claim 9, wherein said control device includes a function generator, said function generator being operable to dictate said modulation of said at least one of said frequency and said phase of said clock signal.

24. The apparatus as set forth in claim 10, wherein said control device includes a function generator, said function generator being operable to dictate said modulation of said at least one of said frequency and said phase of said clock signal.

25. The apparatus as set forth in claim 11, wherein said control device includes a function generator, said function generator being operable to dictate said modulation of said at least one of said frequency and said phase of said clock signal.

26. The apparatus as set forth in claim 12, wherein said control device includes a function generator, said function generator being operable to dictate said modulation of said at least one of said frequency and said phase of said clock signal.

27. A method for discrete-time measurement of a reactance, the method comprising the steps of:
activating the reactance by a clocked generator device with at least one of an electric voltage, an electric current and an electric charge;

generating with an analyzer device an output signal as a function of the reactance to be measured from discrete-time sampled values of said at least one of an electric voltage, an electric current and an electric charge;

controlling said generator device and said analyzer device in synchronism by at least one clock signal; and modulating said clock signal.

28. An apparatus for discrete-time measurement of a reactance, the apparatus comprising:

a generator device, said generator device being operable to selectively couple at least one of an electric voltage, an electric current and an electric charge to said reactance based at least in part on a clock signal;

an analyzer device, said analyzer device being operable to selectively couple to said reactance based at least in part on said clock signal to generate an output signal as a function of said reactance from discrete-time sampling values of said at least one of said electric voltage, said electric current and said electric charge;

a clock generator operably coupled to said generator device and said analyzer device, said clock generator being operable to generate said clock signal for controlling said generator device and said analyzer device in common; and a control device operably coupled to said clock generator, said control device being operable to modulate said clock signal.

* * * * *